United States Patent [19]

Sobota, Jr.

[11] Patent Number: 4,647,126
[45] Date of Patent: Mar. 3, 1987

[54] COMPLIANT LEAD CLIP

[75] Inventor: Stephen M. Sobota, Jr., Mainland, Pa.

[73] Assignee: Sperry Corporation, New York, N.Y.

[21] Appl. No.: 745,050

[22] Filed: Jun. 17, 1985

[51] Int. Cl.[4] .............................................. H01R 9/09
[52] U.S. Cl. ................................. 339/17 CF; 361/405
[58] Field of Search .......... 339/17 CF, 17 M, 17 LM, 339/17 C, 17 N; 174/52 FP; 361/404, 405, 408; 357/69, 70, 75, 80

[56] References Cited

U.S. PATENT DOCUMENTS

| 3,066,367 | 12/1962 | Garman | 24/81 |
|---|---|---|---|
| 3,604,609 | 9/1971 | Walls | 228/180.1 |
| 4,082,407 | 4/1978 | Smorzaniuk et al. | 339/112 R |
| 4,089,575 | 5/1978 | Grabbe | 339/17 CF |
| 4,161,346 | 7/1979 | Cherian et al. | 339/17 M |
| 4,278,311 | 7/1981 | Scheingold et al. | 339/17 CF |
| 4,341,433 | 7/1982 | Cherian et al. | 339/176 MP |
| 4,354,718 | 10/1982 | Bright et al. | 339/17 CF |
| 4,384,757 | 5/1983 | Andrews, Jr. et al. | 339/258 R |
| 4,423,920 | 1/1984 | Cooper et al. | 339/252 R |
| 4,555,151 | 11/1985 | Neese et al. | 339/17 CF |

FOREIGN PATENT DOCUMENTS

| 2710165 | 9/1978 | Fed. Rep. of Germany . | |
| 52-4086 | 1/1977 | Japan | 339/17 M |
| 57-181144 | 11/1982 | Japan | 339/17 CF |

*Primary Examiner*—Neil Abrams
*Attorney, Agent, or Firm*—Griffin, Branigan, & Butler

[57] ABSTRACT

A compliant lead clip comprises a single strip of metal bent to form a C-shaped member and an S-shaped member, the two members having a common portion. An integrated circuit chip is inserted into the C-shaped member and soldered thereto after which the lower part of the S-shaped member is soldered to the top surface of a printed circuit board whereby the chip is supported above the printed circuit board. The S-shaped member bends or twists to absorb forces which would otherwise be exerted on the solder joints as a result of warpage of the printed circuit board or temperature changes where the chip carrier and printed circuit board have different thermal coefficients of expansion.

16 Claims, 5 Drawing Figures

COMPLIANT LEAD CLIP

BACKGROUND OF THE INVENTION

The present invention relates generally to an electrical connector with a resilient clamping finger and more particularly to a support for supporting an integrated circuit chip on a printed circuit board and interconnecting electrical circuits on the chip with circuits on the board.

U.S. Pat. No. 4,384,757 to Andrews et al. discloses a conductive terminal for supporting a ceramic integrated circuit chip on a printed circuit or wiring board and electrically interconnecting circuits on the chip and board. As explained in the patent, printed circuit boards are subject to mechanical and thermal stresses which may cause warpage of the board. In addition, thermal stresses can result from temperature changes and the heat generated by electrical components on the chip. These mechanical and thermal stresses can damage the chip.

The terminal disclosed in the Andrews et al. patent has a rather complex configuration, has different widths over its length, includes a parallel conductor portion to shorten the electrical path, is embedded in an elastomeric material which absorbs some of the stresses, and is intended for insertion into a hole in the printed circuit board. These characteristics create wear problems, place a limit on the minimum spacing which can be attained between adjacent terminals and make the terminals more expensive to manufacture. In addition, the terminal is not suitable for use in situations where it is desired to solder a terminal to a flat surface of the printed circuit board.

The foregoing illustrates limitations known to exist in present devices. Thus, it is apparent that it would be advantageous to provide an alternative directed to overcoming one or more of the limitations set forth above. Accordingly, a suitable alternative is provided including features more fully disclosed hereinafter.

BRIEF SUMMARY OF THE INVENTION

In one aspect of the present invention, this is accomplished by providing a compliant lead clip comprising a C-shaped member and an S-shaped member integrally formed from a single piece of conductive material such that the C-shaped and S-shaped members have a common first portion. The common first portion resiliently supports a first surface of an associated chip. A second portion of the C-shaped member resiliently engages a second surface of the chip and makes electrical contact therewith. A second portion of the S-shaped member resiliently engages a flat surface of an associated printed circuit board and makes electrical contact therewith.

The foregoing and other aspects will become apparent from the following detailed description of the invention when considered in conjunction with the accompanying drawing. It is to be expressly understood, however, that the drawing is not intended as a definition of the invention, but is for the purpose of illustration only.

DETAILED DESCRIPTION OF THE INVENTION

Figure 1:
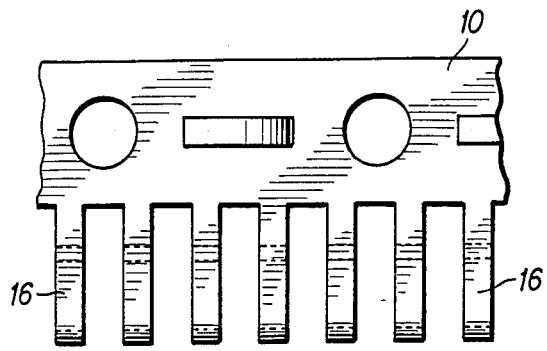
FIG. 1 is a top view of an assembly illustrating an embodiment of compliant lead clips attached to an elongated strip of metal from which the clips are formed.
Figure 2:
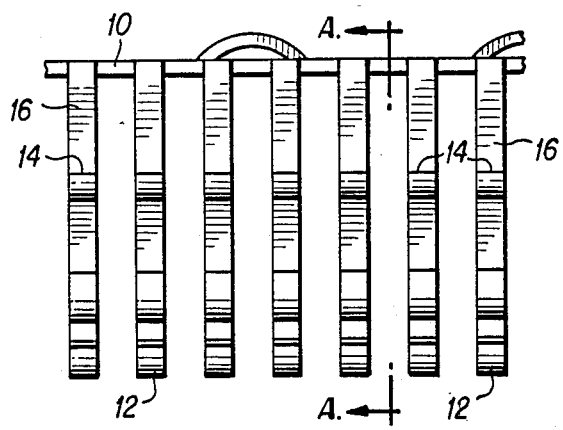
FIG. 2 is a front view of the assembly illustrated in FIG. 1.
Figure 3:
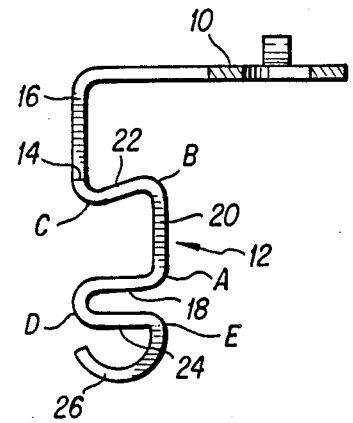
FIG. 3 is a sectional view, taken along the line A—A of FIG. 2 and illustrating an embodiment of a single compliant lead clip still attached to an elongated strip from which it is formed.

Compliant lead clips constructed in accordance with the principles of the present invention are preferably manufactured in ganged assemblies in accordance with known methods. According to a typical method, an elongated strip of flat metal is progressively fed into a machine which removes material from the strip so that there remains a narrower strip somewhat like the strip 10 of FIG. 1 but having spaced flat fingers extending therefrom. Each of the fingers is scored at some point to facilitate subsequent separation. During subsequent steps the portion of each finger beyond its score line is bent or formed into the desired shape. As illustrated in FIGS. 1–3, the result is a strip of ganged compliant lead clips 12 each having a substantially uniform width and thickness and attached at a score line 14 to a portion of a finger 16 extending from the strip 10. The strip 10 may be severed between any two fingers to obtain ganged assemblies containing any desired number of clips.

In accordance with the present invention the clips 12 are each formed as shown in FIG. 3 to comprise a generally C-shaped member and a generally S-shaped member each having a first end portion 18 which is common to both members.

The C-shaped member is bent at A and B to form two further portions 20 and 22. At A the clip is bent so that portion 20 extends at substantially a right angle to portion 18 whereas the clip is bent at B such that the second end portion 22 extends downwardly with an angle of less than 90° being formed between portions 20 and 22. The end of portion 22 opposite the bend B is curved upwardly at C.

The S-shaped member is provided with a bend of approximately 180° at D and includes a second straight portion 24. At the end of portion 24 opposite bend D, the clip is bent at E. A second end portion 26 of the clip beyond bend E is curved concave upwardly.

Figure 4:
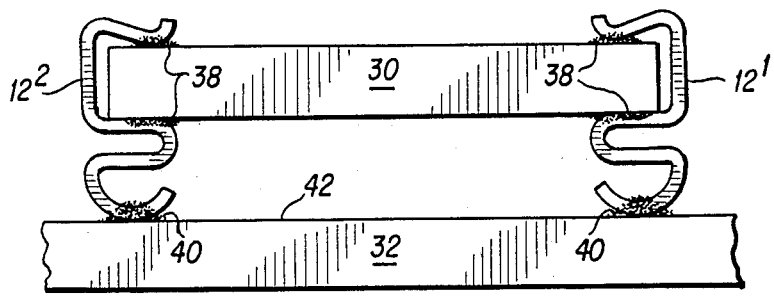
FIG. 4 illustrates the manner in which a chip carrier is mounted on a printed wiring board using a plurality of compliant lead clips; and, FIG. 5 illustrates another embodiment of a compliant lead clip.

In FIG. 4, a miniaturized assembly such as a leadless large scale integrated circuit chip (IC) 30 is shown mounted on a substrate such as a printed circuit board (PCB) 32 using the novel clip comprising the present invention. The mounting is accomplished as follows. One edge of the IC is inserted into the C-shaped members of a plurality of clips 12¹ which are still ganged as illustrated in FIGS. 1 and 2. The opposing edge of the IC 30 is then inserted into the C-shaped members of a second plurality of clips 12² which are similarly ganged. The clips are then soldered to circuits (not shown) on the top and bottom of the IC as indicated at 38. The assembly is then placed on the PCB 32 with the curved portions 26 (FIG. 3) of the clips resting on the surface 42 of the board. After each clip is attached by solder 40 to a circuit (not shown) on the board surface, each clip is broken along the score line 14 (FIG. 3) and the strip 10 and fingers 16 are discarded. What remains is a plurality of individual clips, two of which are visible in FIG. 4, each clip being soldered to the supporting surface 42 of the PCB 32 and each clip being soldered to the upper and lower surfaces of the IC 30 thereby providing support for the chip and also providing electrical interconnection between circuit conductors on the chip and the board.

The compliant clip of the present invention can be quite small and permits high density packing. By way of example and not limitation, the width of each clip 12, as viewed in FIG. 2, may be 0.020" and the distance between centers of adjacent clips may be 0.025". The clip may be formed from 0.01" thick phosphor bronze alloy with a 60/40 tin/lead finish. The bends C and D (FIG. 3) form a throat for guiding an IC chip into the C-shaped member. In this regard, the distance between the common portion 18 and the lowermost portion at bend C is made substantially equal to the thickness of the chip which is to be inserted into the C-shaped member. Thus, the clip places no appreciable stress on the chip. In a typical embodiment, the height of the S-shaped member may be on the order of 0.095" and the clip may be inserted about 0.059" into the throat of the C-shaped member before striking portion 20.

A primary advantage of the compliant clip is that its use reduces solder joint stress and compensates for the different thermal coefficients of expansion of the chip 30 and the PCB 32. Referring to FIG. 4, a temperature change will cause an expansion or contraction of IC 30 and PCB 32 along the dimension seen in the Figure, the expansion or contraction being different for the chip (usually ceramic) and the board. At the same time therein is an expansion or contraction of the IC and the PCB along the dimension which is into the Figure. As a result, torsional shear forces are applied to the solder joints 40 and to the solder joints 38 on the lower surface of the IC 30. The S-shaped construction of the compliant clip absorbs much of the force which would otherwise be applied to the solder joints. More particularly, as the IC 30 moves relative to the PCB 32 the S-shaped member of each compliant clip twists to absorb some of the force. In FIG. 3, the twisting movement of each S-shaped member takes place primarily between, and including, the bends D and E. The S-shaped members work in a similar manner to absorb stresses which result from warpage of the PCB 32.

A further advantage of the compliant clip is that it permits higher density packing of components. As is evident from FIGS. 1 and 2, there are no bends in the clip which extend laterally of the plane of the clip. That is, all bends lie in a single plane. Furthermore, there are no appendages extending laterally of a clip. From inspection of FIG. 2 it is evident that during the manufacturing process the clips may be more closely spaced than if the clips had appendages extending laterally thereof.

Figure 5:
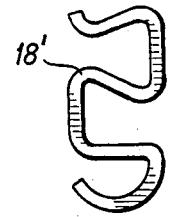

The configuration of the compliant clip may vary somewhat from the configuration shown in FIG. 3. For example, FIG. 5 shows a slightly modified configuration wherein the common portion is curved upwardly as indicated at 18[1].

The foregoing has described a compliant lead clip comprising a C-shaped member and an S-shaped member formed together such that the members have a common first portion which resiliently supports a first surface of an associated chip. A second portion of the C-shaped member resiliently and electrically engages a second surface of the chip. A second portion of the S-shaped member resiliently and electrically engages a flat surface of an associated printed circuit board.

The clip of the present invention reduces solder joint stress, compensates for different thermal coefficients of expansion between an associated chip and a PCB, permits higher density packing of components, avoids wear problems associated with insertable devices and generally reduces manufacturing expense due to a relatively non-complicated configuration of a flexible clip having a uniform width.

The embodiments of the invention in which an exclusive property or privilege is claimed are defined as follows:

1. A compliant lead clip for resiliently supporting an integrated circuit chip in spaced relation parallel to a flat surface of a printed circuit board and for making an electrical connection between circuits on the chip and circuits on the printed circuit board, said compliant lead clip comprising:
   a single piece of flat conductive material having a uniform width, and thickness throughout its length shaped to form a C-shaped member and an S-shaped member;
   a first portion of the C-shaped member being a common first portion of the S-shaped member, the common first portion of the C-shaped and S-shaped members being of a construction sufficient for resiliently supporting a first surface of the chip;
   a second portion of the C-shaped member of a construction sufficient for resiliently engaging a second surface of the chip and for making electrical contact therewith;
   a second portion of the S-shaped member being adapted to resiliently rest upon the flat surface of the printed circuit board and make electrical contact therewith, said second portion being curved concave away from said printed circuit board such that only a curved surface thereof makes contact with said flat surface essentially along a single line.

2. The lead clip of claim 1 including:
   an extension member severably connected to the second portion of the C-shaped member.

3. The lead clip of claim 1 wherein the C-shaped member includes an end opening in a first direction and being between the common first portion of the C-shaped and S-shaped members and the second portion of the C-shaped member;
   the S-shaped member includes a first end opening in a second direction opposite the first direction and being adjacent the common first portion; and
   the S-shaped member further includes a second end opening in the first direction and being adjacent the second portion of the S-shaped member.

4. A compliant lead clip as claimed in claim 1 wherein said single piece of metal has a uniform rectangular cross-section throughout its length.

5. Electrical connector means for resiliently supporting an integrated circuit chip in spaced relation parallel to a surface of a printed circuit board and for making an electrical connection between circuits on said chip and circuits on the printed circuit board, said electrical connector means comprising:
   a single metallic element having a length configuration comprising an S-shaped member and a C-shaped member with a uniform width, and thickness throughout its length;
   said S-shaped member and said C-shaped member having a common portion which is a first end portion of both of said members;

said S-shaped member having a second end portion for contacting said surface of said printed circuit board, said second portion being curved concave away from said printed circuit board such that only a curved surface thereof makes contact with said flat surface essentially along a single line;

said C-shaped member having a second end portion contacting a first surface of said chip;

said common portion contacting a second surface of said chip to support said chip; and, solder means for connecting the second end portion of said S-shaped member to said surface of said printed circuit board.

6. An electrical connector means as claimed in claim 5 wherein said single metallic element has a uniform width and thickness throughout its entire length.

7. An electrical connector means as claimed in claim 6 and further comprising second solder means for connecting said C-shaped portion to at least one surface of said chip.

8. An electrical connector means as claimed in claim 6 and further comprising second solder means for connecting said common portion to said first surface of said chip and said second end portion of said C-shaped member to said second surface of said chip.

9. An electrical connector means as claimed in claim 8 wherein the spacing between said first and second end portions of said C-shaped member is approximately equal to the distance between said first and second surfaces of said chip.

10. An electrical connector means as claimed in claim 7 wherein the spacing between said first and second end portions of said C-shaped member is approximately equal to the thickness of said chip.

11. An electrical connector as claimed in claim 5 wherein said single metallic element consists of said S-shaped member and said C-shaped member having said common portion.

12. An electrical connector means as claimed in claim 6 wherein said single metallic element has a uniform rectangular cross-section throughout its length.

13. A compliant lead clip for resiliently supporting an integrated circuit chip in spaced relation parallel to a surface of a printed circuit board and for making an electrical connection between circuits on said chip and circuits on the printed circuit board, said compliant lead clip consisting of:

a C-shaped member and an S-shaped member integrally formed from a single piece of conductive material having a uniform width, and thickness througout its length;

a first portion of the C-shaped member being a common first portion of the S-shaped member, the common first portion of the C-shaped and S-shaped members being a resilient support for the chip;

a second portion of the C-shaped member being a resilient electrical contact for contacting circuits on the chip;

a second portion of the S-shaped member being a resilient support and an electrical contact for contacting said surface of said printed circuit board said second portion being curved concave away from said printed circuit board such that only a curved surface thereof makes contact with said printed circuit board surface essentially along a single line;

the C-shaped member including an end opening in a first direction and being between the common first portion of the C-shaped and S-shaped members and the second portion of the C-shaped member for receiving an edge of said chip into said opening;

the S-shaped member including a first end opening in a second direction opposite the first direction and being adjacent the common first portion; and the S-shaped member including a second end opening in the first direction and being adjacent the second portion of the S-shaped member.

14. The lead clip of claim 13 including:

an extension member severably connected to the second portion of the C-shaped member.

15. A compliant lead clip as claimed in claim 13 wherein said C-shaped member and said S-shaped member comprise a single piece of metal having a uniform width and thickness throughout its length.

16. A compliant lead clip as claimed in claim 13 wherein said single piece of metal has a uniform rectangular cross-section throughout its length.

* * * * *